United States Patent [19]

Shinohara et al.

[11] Patent Number: 4,858,077
[45] Date of Patent: Aug. 15, 1989

[54] CONDENSER-CONTAINING, CERAMIC MULTI-LAYER CIRCUIT BOARD AND SEMICONDUCTOR MODULE AND COMPUTER HAVING THE CIRCUIT BOARD

[75] Inventors: Hiroichi Shinohara, Hitachi; Hideo Suzuki, Katsuta; Satoru Ogihara, Hitachi, all of Japan

[73] Assignee: Hitachi, Ltd., Tokyo, Japan

[21] Appl. No.: 276,029

[22] Filed: Nov. 25, 1988

[30] Foreign Application Priority Data

Nov. 25, 1987 [JP] Japan ................. 62-295360

[51] Int. Cl.4 .................... H01L 23/02; H02M 7/538; H05K 1/18
[52] U.S. Cl. .................................. 361/414; 174/68.5; 357/51; 363/132
[58] Field of Search ............... 361/414, 416, 321, 302; 363/131, 132; 174/68.5; 357/51

[56] References Cited

U.S. PATENT DOCUMENTS 4,322,778 3/1982 Barbour et al. ................. 174/68.5 X
4,407,007 9/1983 Desai et al. ..................... 174/68.5 X
4,670,833 6/1987 Sachs .............................. 361/414 X
4,706,165 11/1987 Takenaka et al. ............... 361/414 X

FOREIGN PATENT DOCUMENTS

37818 3/1982 Japan .
56217 11/1982 Japan .
244631 10/1987 Japan .

Primary Examiner—Donald A. Griffin
Attorney, Agent, or Firm—Antonelli, Terry & Wands

[57] ABSTRACT

A condenser-containing, ceramic multi-layer circuit board which comprises a plurality of layers of ceramic insulating material having circuit conductors, throughholes and condensers composed of ceramic dielectric condenser material having a higher dielectric constant than that of the ceramic insulating material and a pair of electrodes sandwiching the ceramic dielectric condenser material, the condensers being in a layer structure with openings concentric to the individual throughholes and having a larger diameter than the diameter of the throughholes with a distance between the condenser opening edges surrounding the corresponding throughholes and the throughhole peripheral edges, thereby forming clearances therebetween and the ceramic insulating material being filled in the clearances between the condenser opening edges and the corresponding throughhole peripheral edges without any contact with the ceramic dielectric condenser material and the throughholes can reduce electric noises owing to the presence of the condenser without impairing the signal transmission speed, when applied to a board for a large-scale electronic computer, thereby making the computing speed faster than the conventional one.

12 Claims, 4 Drawing Sheets

CONDENSER-CONTAINING, CERAMIC MULTI-LAYER CIRCUIT BOARD AND SEMICONDUCTOR MODULE AND COMPUTER HAVING THE CIRCUIT BOARD

BACKGROUND OF THE INVENTION

This invention relates to a condenser-containing, ceramic multi-layer circuit board and a semiconductor module and a computer having the said circuit board.

With recent demands for faster electronic computers, the number of logical circuits susceptible to the simultaneous switching is increasing and generation of noises due to the simultaneous switching has been so far problems. In order to reduce the noises due to the simultaneous switching, it has been proposed to insert condensers into the circuits. [Japanese Patent Application Kokai (Laid-open) No. 57-56217]. By the insertion of the condensers, the noise voltage can be reduced and if the permissible noise level can be further made equal to the conventional noise level, the rise time of signal wave form, etc. can be shortened, so that a computing speed can be made about 1.5 times as high. Furthermore, the signal wave form can be effectively improved by the insertion of the condensers.

In order to fully obtain the effect of the condenser, the condenser must be provided as near a semiconductor chip as possible. In order to provide the condenser at a higher density, the condenser must be provided in a ceramic multi-layer circuit board.

Heretofore, a multi-layer circuit board having a condenser has been disclosed, for example, in Japanese Patent Applications Kokai (Laid-open) No. 57-37818 and 62-244631. That is, Japanese Patent Application Kokai (Laid-open) No. 57-37818 proposes to provide a number of small independent condenser elements in parallel connection in the individual layers in order to reduce the thermal stress due to a difference in the thermal expansion between the condenser dielectric material and the insulating material.

Japanese Patent Application Kokai (Laid-open) No. 62244631 proposes to provide a number of condensers in the individual layers in such a structure that the condenser dielectric material is in contact with the througholes through which electrical signals are transmitted. When the condenser dielectric material is provided in contact with the throughholes, as disclosed in Japanese Patent Application Kokai (Laid-open) No. 62-244631, a large time delay takes place in the transmission of electrical signals through the resions of high dielectric constant, and the higher speed effect ascribed to the provision of the condensers cannot be fully attained.

SUMMARY OF THE INVENTION

An object of the present invention is to provide a condenser-containing, ceramic multi-layer circuit board without impairing the electric signal transmission speed and a semiconductor module and a computer having the circuit board.

That is, the present invention provides a condenser-containing, ceramic multi-layer circuit board which comprises a plurality of layers of ceramic insulating material having circuit conductors, throughholes and condensers composed of ceramic dielectric condenser material having a higher dielectric constant than that of the ceramic insulating material and a pair of electrodes sandwiching the ceramic dielectric condenser material, the condensers being in a layer structure with openings concentric to the individual throughholes and having a larger diameter than the diameter of the throughholes with a distance between the condenser opening edges surrounding the corresponding throughholes and the throughhole peripheral edges, thereby forming clearances therebetween and the ceramic insulating material being filled in the clearances between the condenser opening edges and the corresponding throughhole peripheral edges without any contact with the ceramic dielectric condenser material and the throughholes.

The present invention further provides a semiconductor module which comprises a multilayer board, a carrier board provided on the multi-layer board and a semiconductor device provided on the carrier board, the carrier board being a condenser-containing, ceramic multi-layer circuit board which comprises a plurality of layers of ceramic insulating material having circuit conductors, throughholes and condensers composed of ceramic dielectric condenser material having a higher dielectric constant than that of the ceramic insulating material and a pair of electrodes sandwiching th ceramic dielectric condenser material, the condensers being in a layer structure with openings concentric to the corresponding throughholes and having a larger diameter than the diameter of the throughholes with a distance between the condenser opening edges surrounding the corresponding throughholes and the throughhole peripheral edges, thereby forming clearances therebetween and the ceramic insulating material being filled in the clearances between the condenser opening edges and the corresponding throughhole peripheral edges without any contact with the ceramic dielectric condenser material and the throughholes.

The present invention still further provides a computer which comprises a semiconductor module which comprises a multi-layer board, a carrier board provided on the multi-layer board and a semiconductor device provided on the carrier board, the carrier board being a condenser-containing, ceramic multi-layer circuit board which comprises a plurality of layers of ceramic insulating material having circuit conductors, throughholes and condensers composed of ceramic dielectric condenser material having a higher dielectric constant than that of the ceramic insulating material and a pair of electrodes sandwiching the ceramic dielectric condenser material, the condensers being in a layer structure with openings concentric to the corresponding throughholes and having a larger diameter than the diameter of the throughholes with a distance between the condenser opening edges surrounding the corresponding throughholes and the throughhole peripheral edges, thereby forming clearances therebetween and the ceramic insulating material being filled in the clearances between the condenser opening edges and the corresponding throughhole peripheral edges without any contact with the ceramic dielectric condenser material and the throughholes.

Increased delay of the signal transmitting through the throughholes in the structure of the conventional condenser-containing ceramic multi-layer circuit board is due to the contact of the condenser dielectric material of high dielectric constant with the throughholes. The present invention is based on such a structure that an insulating material of low dielectric constant is provided in clearances between the opening edges of the condenser dielectric material of high dielectric constant surrounding the corresponding throughholes and the corresponding throughhole peripheral edges. With this structure the influence of the condenser dielectric material having a high dielectric constant upon the time delay in the electric signal transmission through the throughholes can be reduced.

Suppose that the computing speed can be made about 1.5 times as high by inserting a condenser layer having openings concentric to the throughholes and surrounding the corresponding throughholes with a distance into the circuit, and filling the insulating material into the clearances therebetween, thereby reducing the electric noise, and that the dielectric constant of the ceramic insulating material is 5, that of the ceramic dielectric material 10,000 and the throughhole diameter 100 μm in case of forming a condenser layer having a thickness of about 50 μm in a ceramic multi-layer circuit board having a thickness of 1 mm. In order to make the signal transmission speed through the board higher than that without any condenser layer, it is necessary to suppress an increase in the time delay through the board due to the provision of the condenser layer to less than 50%. The distance between the throughhole peripheral edge and the corresponding opening edge of the condenser dielectric material surrounding the individual throughholes must be 5 μm or more.

Furthermore, when the throughholes are provided at a pitch of 500 μm, the distance between the throughhole peripheral edges and the corresponding opening edges of the condenser dielectric material surrounding the individual throughholes must be less than 200 μm. So long as the distance between the throughhole peripheral edges and the corresponding opening edges is 5 μm or more, a change in the distance has a smaller influence upon the signal transmission speed through the throughholes, and thus such a distance is preferable for the preparation of the boards. More preferably, the distance must be 50 μm or more in view of suppression of an increase in the delay time to less than 20% and a higher reliability in the preparation of the boards.

The present invention will be described in detail below, referring to the accompanying drawings.

BRIEF DESCRIPTION OF THE INVENTION

DETAILED DESCRIPTION OF THE INVENTION

A condenser dielectric material can be formed in a multi-layer circuit board by a green sheet method using a green sheet of condenser dielectric material, a thick film printing method, sputtering, CVD, vapor deposition, etc.

Preparation of a condenser-containing, ceramic multi-layer circuit board by a green sheet method or a thick film printing method will be described below, referring to FIGS. 1A and 1B.

Figure 1A:
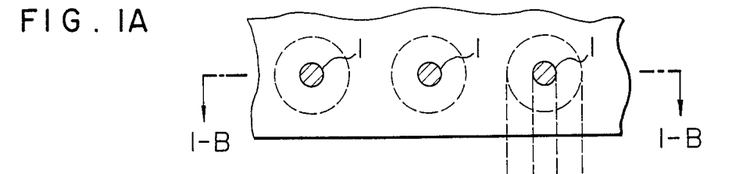
FIG. 1A is a schematic plan view showing a condenser-containing, ceramic multi-layer circuit board according to one embodiment of the present invention.
Figure 1B:
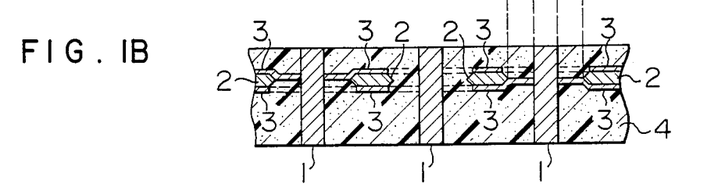
FIG. 1B is a cross-sectional vertical view along the line 1B—1B of FIG. 1A.

FIG. 1A is a schematic plan view showing a condenser-containing, ceramic multi-layer circuit board and FIG. 1B is its cross-sectional view along the line 1B—1B of FIG. 1A, where numeral 1 is a throughhole, 2 a condenser ceramic dielectric material in a layer structure, 3 electrode conductors, and 4 a ceramic insulating material. As shown in FIGS. 1A and 1B, openings concentric to the throughholes and having a larger diameter than that of the throughholes are provided through a relatively thin condenser dielectric material layer (condenser green sheet) to provide clearances between the condenser dielectric material opening edges and the corresponding throughhole peripheral edges. Then, the condenser green sheet is sandwiched between deformable insulating material green sheets, and pressed together with a hot press, whereby the insulating material of the insulating material green sheets is entered into the clearances between the condenser dielectric material opening edges and the corresponding throughhole peripheral edges. Then, the resulting laminate is fired, whereby such a structure that the dielectric material of low dielectric constant exists in the clearances between the condenser dielectric material opening edges and the corresponding throughhole peripheral edges can be obtained.

The condenser dielectric material of high dielectric constant for use in the present invention must have a dielectric constant of at least about 5,000 and can be sintered at a temperature of not more than 1,000° C., and includes, for example, a solid solution of perovskite structure composed of PbO, $Fe_2O_3$, $WO_3$, $PbTiO_3$, etc.

As already described above, a ceramic insulating material of low dielectric constant is provided in clearances between the opening edges of condenser ceramic dielectric material surrounding the corresponding throughholes with a distance and the peripheral edges of the corresponding throughholes in the present invention, whereby the influence of the condenser dielectric material having a high dielectric constant and giving a delay in the electrical signal transmission through throughholes can be reduced. The ceramic insulating material for use in the present invention includes, for example, borosilicate glass, borate glass containing $SiO_2$ powder and $Al_2O_3$ powder, borosilicate glass containing alumina, etc., which can be sintered at a temperature of not more than 1,000° C. As the insulating material around the condenser dielectric material, organic insulating materials such as polyimide resin can be also used.

The electrode material, wiring conductor material and throughhole conductor material for use in the present multi-layer circuit board includes, include for example, Ag-Pd, Au and Ag.

With the aforementioned structure of the present condenser-containing, ceramic multi-layer circuit board, using the aforementioned materials, the signal transmission speed through the throughholes can be less impaired.

PREFERRED EMBODIMENTS OF THE INVENTION

The present invention will be described in detail below, referring to Examples, where parts and % are by weight.

EXAMPLE 1

A condenser-containing, ceramic multi-layer circuit board was prepared in the following manner.

At first, a slurry for an insulating material green sheet was prepared by mixing glass powder composed of 9 to 15% of MgO, 0 to 5% of CaO, 35 to 45% of $Al_2O_3$ and 40 to 55% of $B_2O_3$ in terms of the oxides, the total being 100%, and having an average particle size of 5 $\mu$m with $SiO_2$ powder having an average particle size of 1 $\mu$m as raw material powder in a mixing ratio of the glass powder to the $SiO_2$ powder of 95-40 to 5-60, and adding 20 parts of a methacrylate-based binder, 124 parts of trichloroethylene, 32 parts of tetrachloroethylene and 44 parts of n-butyl alcohol to 100 parts of the resulting raw material powder mixture, and subjecting the mixture to wet blending in a ball mill for 24 hours. Then, the resulting slurry was adjusted to an appropriate viscosity by vacuum deaeration treatment, applied to a silicone-coated polyester film to a thickness of 0.5 mm by a doctor blade, and dried. Then, the polyester film was removed therefrom to obtain an insulating material green sheet.

Likewise, a condenser dielectric material green sheet having a thickness of 50 $\mu$m was prepared from a dielectric ceramic material composed mainly of PbO, $Fe_2O_3$, $WO_3$, $TiO_2$ and $Nb_2O_5$ and having a structural formula of $Pb(Fe_{\frac{1}{2}}Nb_{\frac{1}{2}})O_3 - Pb(Fe_{\frac{1}{2}}W_{\frac{1}{2}})O_3 \cdot PbTiO_3$ and a dielectric constant of about 10,000.

In FIGS. 2A, 2B, 2C and 2D, steps for preparing the condenser-containing, ceramic multi-layer circuit board are shown.

Figure 2A:
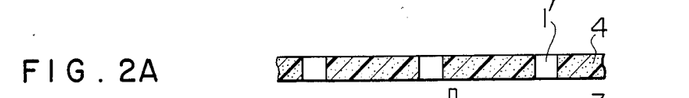
FIGS. 2A, 2B, 2C and 2D show steps of preparing a condenser-containing ceramic multi-layer circuit board according to the present invention.
Figure 2B:
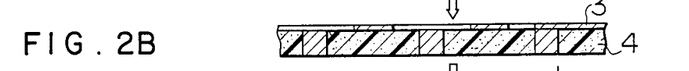

As shown in FIG. 2A, the insulating material green sheet 4 composed of the glass powder and the $SiO_2$ powder was provided with a plurality of holes 1' having a diameter of 100 $\mu$m at a pitch of 450 mm, and then, as shown in 2B, an Ag-Pd conductor paste having a Pd content of 15 to 30% and an appropriately adjusted viscosity was filled in the holes 1' through the insulating material green sheet 4 as throughholes 1 and an electrode pattern 3 identical to the pattern of a condenser and partially with connection conductor parts from the electrode pattern 3 to the throughholes 1 was printed on the insulating material green sheet 4 with an Ag-Pd conductor paste having a Pd content of 15 to 30%.

Figure 2C:
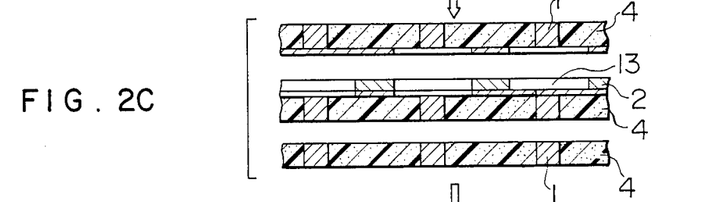
Figure 2D:
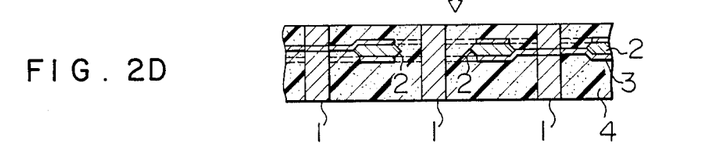

Then, as shown in FIG. 2C, the condenser dielectric material green sheet 2 was provided with the same number of opening 13 concentric to the holes 1' and having a diameter of 300 $\mu$m, and placed on the insulating material green sheet 4 with the Ag-Pd conductor paste-filled throughholes 1 and the Ag-Pd conductor paste-printed electrode pattern. Then, another insulating material green sheet with the throughholes and the electrode pattern prepared in the same manner as above was placed on the condenser dielectric material green sheet 2 so that the condenser dielectric material green sheet 2 can be sandwiched between the electrode patterns 3 on the upper and lower insulating material green sheets 4. Then, the same insulating material green sheets only with the Ag-Pd conductor paste filled throughholes were placed thereon, and the resulting laminate was pressed with a hot press under pressing conditions of 100° C. and 10 kg f/$cm^2$, whereby a board shown in FIG. 2D was obtained. That is, the insulating material was entered from the insulating material green sheets into the clearances between the condenser dielectric material opening edges and the corresponding throughhole peripheral edges by the pressing. The thus prepared laminate board was heated at a temperature increase rate of less than 100° C./hr to remove the binder therefrom, then defatted at 500° C. for 3 hours and then fired at 900° to 1,000° C. at a temperature increase rate of 200° C./hr in the air.

The capacity of condenser formed in the thus prepared board was about 0.1 $\mu$F and the thickness of the condenser dielectric material layer was 40 $\mu$m. Neither cracking nor peeling was observed at all on the insulating material around the condenser. Neither warping nor deformation of the board was observed at all. According to this example, the electrical signal transmitting through the throughholes in the board had a time delay of 40% on the basis of the time delay when the condenser dielectric material is in contact with the throughholes, since there was the insulating material of low dielectric constant in clearances between the condenser dielectric material opening edges and the corresponding throughhole peripheral edges, and thus the signal transmission could be made 60% faster. The condenser-containing, ceramic multi-layer circuit board of this Example had a thickness of 1 mm, a distance of 80 $\mu$m between the condenser dielectric material opening edges and the corresponding throughhole peripheral edges and a throughhole diameter of 80 $\mu$m.

EXAMPLE 2

On the electrode pattern on the dried insulating material green sheet with Ag-Pd conductor paste-filled throughholes and the Ag-Pd conductor paste-printed condenser electrode pattern prepared in Example 1 and shown in FIG. 2B, a paste of the same dielectric material as used in Example 1 was printed as shown in FIG. 2C to provide a condenser dielectric material layer, as shown in FIG. 2C, and another insulating material green sheet with the filled throughholes and the condenser electrode pattern was placed thereon in the same manner as in Example 1, and also a plurality of the insulating material green sheets were placed thereon and then the resulting laminate was pressed and fired in the air in the same manner as in Example 1.

The capacity of the condenser contained in the thus prepared board was about 0.2 $\mu$F and the thickness of the condenser dielectric material layer was 20 $\mu$m. Neither cracking nor peeling was observed at all on the insulating material around the condenser, and neither warping nor deformation of the board was observed at all. The distance between the condenser dielectric material opening edges and the corresponding throughhole peripheral edges was 80 $\mu$m, and the time delay of this Example based on the time delay when the condenser dielectric material was in contact with the throughholes was 60%, and the signal transmission could be made 40% faster.

EXAMPLE 3

An insulating material green sheet was prepared from a slurry made by mixing 100 parts of $LiO_2$-$Al_2O$-$SiO_2$-based glass powder composed of 10 to 13% of $Li_2O$, 70 to 80% of $SiO_2$, 5 to 15% of $Al_2O_3$, 2 to 3% of $K_2O$ and 1 to 2% of $CaF_2$, total being 100%, in terms of oxides and having an average particle size of 5 μm with 88 parts of polyvinylbutyral having a degree of polymerization of 4,000, 124 parts of trichloroethylene, 32 parts of tetrachloroethylene and 44 parts of n-butyl alcohol in a ball mill for 24 hours in the same manner as in Example 1.

Then, the holes of the insulating material green sheet were filled with the Ag-Pd conductor paste an the condenser electrode pattern was printed with the Ag-Pd conductor paste in the same manner as in Example 1.

Then, the condenser dielectric material green sheet having openings concentric to the corresponding throughholes and having a larger diameter than that of the corresponding throughholes, prepared in the same manner as in Example 1, was sandwiched between the insulating material green sheets prepared above and a plurality of the insulating material green sheets only with the throughholes were placed thereon, and the resulting laminate was pressed and fired at 900° to 950° C. in the air.

The capacity of the condenser formed in the resulting board was about 0.1 μF and the thickness of the condenser dielectric material layer was 40 μm. Neither cracking nor peeling was observed at all on the insulating material around the condenser dielectric material. The distance between the condenser dielectric material opening edges and the corresponding throughhole peripheral edges was 80 μm. The time delay of this Example was 40% on the basis of the time delay when the condenser dielectric material was in contact with the throughholes, and thus the signal transmission could be made 60% faster.

EXAMPLE 4

Filling of the throughholes and printing of condenser electrode pattern of the insulating material green sheet prepared in Example 3 were carried out with the same Ag-Pd conductor paste and printing of the condenser pattern was carried out with the same condenser dielectric material as used in Example 2, and then further lamination and pressing were carried out in the same manner as in Example 2, and then the resulting laminate was fired at 900° to 950° C. in the air.

The capacity of the condenser formed in the resulting board was about 0.2 μF and the thickness of the condenser dielectric material layer was 20 μm. Neither cracking nor peeling was observed at all on the insulating material around the condenser dielectric material. The distance between the condenser dielectric material opening edges and the corresponding throughhole peripheral edges was 80 μm and the time delay of this Example was 60% on the basis of the time delay when the condenser dielectric material was in contact with the throughholes. Thus, the signal transmission could be made 40% faster.

EXAMPLE 5

A condenser-containing, ceramic multi-layer circuit boards were prepared in the same manner as in Examples 1 to 4 except that the filling of throughholes and printing of condenser electrode patterns and connection parts were carried out with a gold paste in place of the Ag-Pd conductor paste. Neither cracking nor peeling was observed at all on the insulating material around the condenser dielectric material. By use of the gold paste, highly reliable, condenser-containing, ceramic multi-layer circuit board could be obtained against migration, etc. The time delay of this Example was 40 to 60% on the basis of the time delay when the condenser dielectric material was in contact with the throughholes. That is, the signal transmission could be made 60 to 40% faster.

EXAMPLE 6

Figure 3:
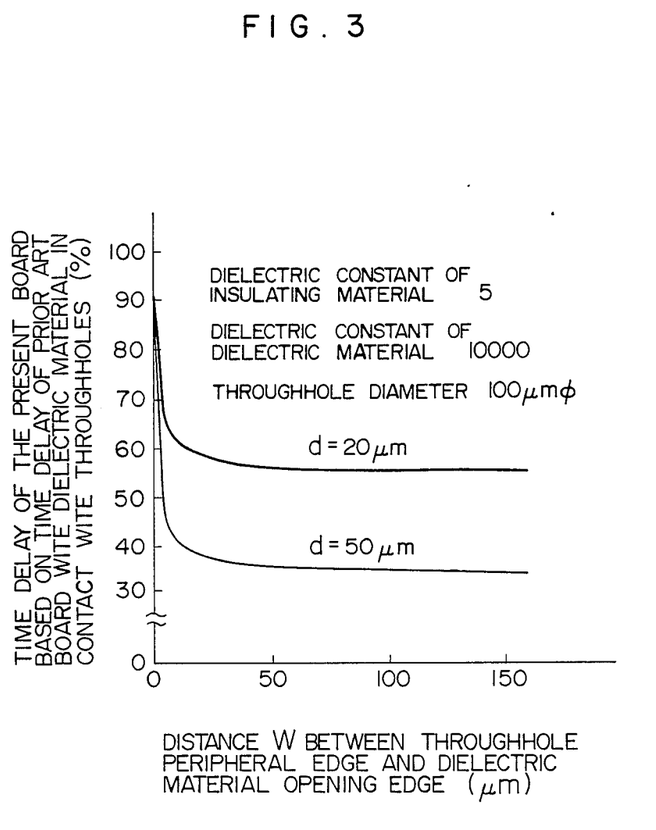
FIG. 3 is a diagram showing a relationship between the distance between the throughhole peripheral edge and the condenser dielectric material opening edge and the time delay.

Condenser-containing, ceramic multi-layer circuit boards with varied distances between the condenser dielectric material opening edges and the corresponding throughhole peripheral edges were prepared by the green sheet method in the same manner as in Example 1 and by the thick film printing method in the same manner as in Example 2. The thickness "d", as defined in FIG. 4B, of the condenser dielectric material layer was about 50 μm for the board prepared by the green sheet method and about 20 μm for the board prepared by the thick film printing method. The time delay of electrical signal transmitting through the throughholes increased if the condenser dielectric material approached the throughholes. FIG. 3 shows a relationship between the distance W (μm on the abscissa) between the condenser dielectric material opening edges and the throughhole peripheral edges and the time delay (% on the ordinate) of the condenser-containing boards on the basis of the time delay when the condenser dielectric material was in contact with the throughholes (100%).

EXAMPLE 7

Condenser-containing, ceramic multi-layer circuit boards with varied thickness of the condenser dielectric material layer were prepared in the same manner as in Examples 1 to 4.

Figure 4A:
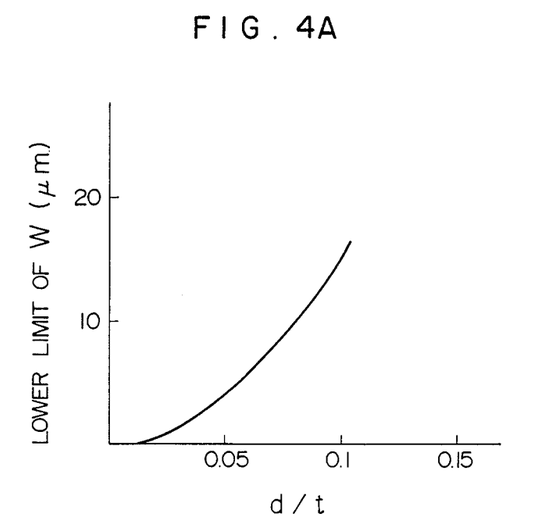
FIG. 4A is a diagram showing a relationship between a ratio of the condenser thickness to the board thickness and a lower limit of the distance between the condenser dielectric material opening edge and the corresponding throughhole peripheral edge necessary for suppressing an increase in the time delay to less than 50%.

FIG. 4A shows a relationship between a ratio of the thickness "d" of condenser dielectric material layer to the thickness "t" of the board (on the abscissa) i.e., t/d, and the necessary and minimum distance "W" between the condenser dielectric material opening edges and the corresponding throughhole peripheral edges for suppressing an increase in the time delay of transmitted signals to less than 50% on the basis of the absence of the condenser dielectric material in the board.

Figure 4B:
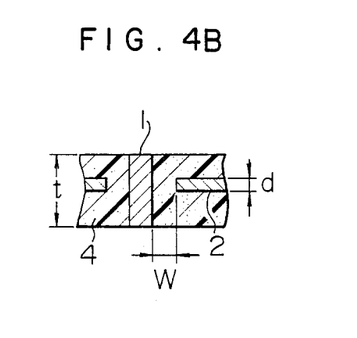
FIG. 4B is a schematic cross-sectional view of a condenser-containing board defining symbols used in FIG. 4A.

FIG. 4B defines the terms, "W", "d" and "t" used in FIG. 4A.

EXAMPLE 8

On a plurality of laminates of a condenser dielectric material layer prepared in the same manner as in Example 1 or 2, sandwiched between the insulating material green sheets prepared in the same manner as in Example 1, 2, 3 or 4 and provided with the filled throughholes and the printed condenser electrode patterns in the same manner as in Example 1 were placed a plurality of insulating material green sheets with the filled throughholes at different positions from those of the first insulating material green sheets and also with the wirings. The resulting laminate was pressed and fired at 900° C. to 1,000° C. in the air. The thus prepared ceramic multi-layer circuit board containing a plurality of condenser dielectric material layers and the wirings is shown in FIG. 5.

Neither cracking nor peeling was observed at all on the insulating material around the condenser dielectric material. Furthermore, neither warping nor deformation of the board was observed at all. It was possible to provide a plurality of condenser dielectric material layers in a ceramic multi-layer circuit board as in this Example. The time delay of this Example was about 30 to 40% on the basis of the delay time when the condenser dielectric material was in contact with the throughholes and thus the signal transmission could be made 70–60% faster.

EXAMPLE 9

Figure 5:
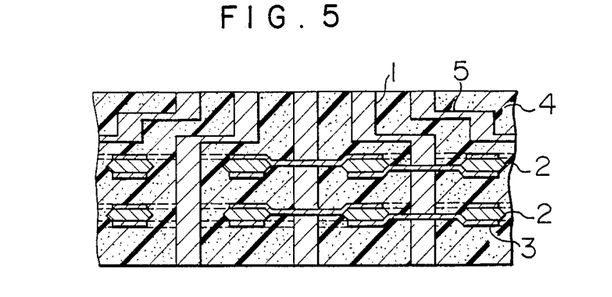
FIG. 5 is a schematic diagram showing a ceramic multi-layer circuit board containing a circuit and a plurality of condensers in a layer structure.
Figure 6:
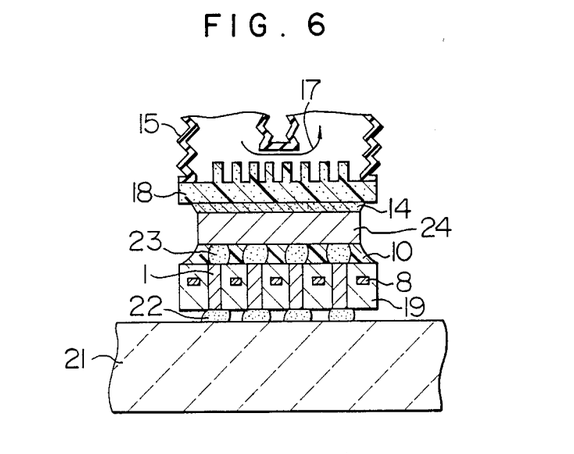
FIG. 6 is a schematic view of a semiconductor module provided with a condenser-containing ceramic multi-layer circuit board according to the present invention as a carrier board.

The condenser-containing, ceramic multi-layer circuit board prepared in Example 8 and shown in FIG. 5 was applied as a carrier board for a semiconductor module as shown in FIG. 6.

FIG. 6 shows one embodiment of a semiconductor module having the present condenser-containing, ceramic multi-layer circuit board as a carrier board, where a Si chip 24 as a semiconductor device was connected to a Si chip cooling plate 18 through a low melting solder 14 at the back side, and the cooling plate 18 was connected to a nickel bellows 15, through which water 17 flows to cool the cooling plate 18. The electrodes on the surface of the Si chip 24 were connected to the upper surface of the condenser-containing, ceramic multi-layer circuit board as the carrier board 19 through solder (Pb-5% Sn) bumps, and the clearances between the Si chip 24 and the carrier board 19 were filled with resin 10. The parts on the lower surface of the carrier board 19, as electrically connected to the soldered parts on the upper surface of the carrier board 19 through the throughholes 1, were further connected to a multi-layer board 21 through solder bumps 22 (Pb-60% Sn), that is, to the desired printed circuits in the multi-layer board 21. In the structure of FIG. 6, the Si chip 24 and the carrier substrate 19, as connected to each other through the solder bumps 23, with the resin 10 filled in the clearances between the solder bumps 23 constitute a semiconductor package structure.

The resin 10 was an epoxy resin containing quartz power, etc. and having a coefficient of thermal expansion on the same level as that of the solder bumps 23. The multi-layer board 21 was composed of $Al_2O_3$. The solder bumps 22 were different in composition from the solder bumps 23 and had a lower melting point to facilitate resoldering.

The resin 10 had a coefficient of thermal expansion substantially on the same level as that of the solder bumps 23 to make stress dispersion and the carrier substrate 19 had a coefficient of thermal expansion substantially on the same level as that of the multi-layer board 21 to prevent a thermal stress between the carrier board 19 and the multi-layer board 21. That is, a thermal stress due to a difference in the coefficient of thermal expansion between the semiconductor chip 24 and the multi-layer board was prevented thereby. At the same time, the semiconductor chip 24 and the multi-layer board could be readily resoldered together with the carrier board 19, and the semiconductor chip or the semiconductor module could be readily and economically inspected or maintained.

In this Example, the multi-layer board 21 was composed of 30 layers with a tungsten conductor, where the tungsten on the surface conductor layer was plated with nickel and coated with gold. On the surface of semiconductor chip 24, a $SiO_2$ film was formed on the Al film, whereas, on the electrode parts, the $SiO_2$ film was removed and a Cr film having a thickness of 0.7 $\mu$m, a Cu film having a thickness of 3 $\mu$m and an Au film having a thickness of 0.1 $\mu$m were formed with Cr-CuAu instead.

The Si chip surface could be directly or indirectly cooled with a liquid. Beside the structure shown in FIG. 6, an cooling or liquid cooling could be carried out through a metal, ceramics, etc. as a heat transmission medium.

With this structure, the reliability of connecting the semiconductor device to the multi-layer board could be enhanced. Furthermore, the condenser layers could be provided at positions as near the semiconductor device as possible and thus the simultaneous switching noise could be effectively reduced.

With the condenser contained in the ceramic multi-layer circuit board, the computing speed of a large scale electronic computer could be made 50% faster.

EXAMPLE 10

Figure 7:
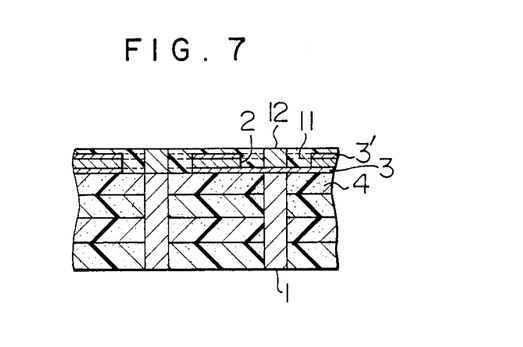
FIG. 7 is a schematic diagram of a condenser-containing multi-layer circuit board, where polyimide is used as an insulating material around the condenser.

FIG. 7 schematically shows an application of polyimide resin as an insulating material around the condenser dielectric material layer.

In case of the green sheet method, the insulating material green sheet 4 prepared in the same manner as in Example 1 or Example 3 was provided with holes for the throughholes, which were filled with the same conductor paste as used in Example 1 and a condenser electrode pattern 3 was printed on the upper surface of green sheet 4 with an Ag-Pd conductor paste as shown in FIG. 7. Then, a condenser dielectric material green sheet 2 prepared in the same manner as in Example 1 was printed with the electrode pattern 3' on the upper surface.

Then, the insulating material green sheet 4 with the filled throughholes and the condenser electrode pattern, the condenser dielectric material green sheet 2 with the electrode pattern on the upper surface as a top layer, and a plurality of insulating material green sheets 4 only with the filled throughholes were laid upon each other and the resulting laminate was pressed and fired in the same manner as in Example 1. Polyimide resin 11 was applied to the surface of the thus prepared board on the condenser dielectric material green sheet side so as to fully coat the condenser dielectric material layer as a top layer and fill the openings of the condenser dielectric material layer. Then, the polyimide resin in the regions 12 corresponding to the throughholes in the openings of the condenser dielectric material layers by etching and throughholes of Cu conductor was formed in the regions 12 corresponding to the throughholes in the openings by electroless plating.

In case of the thick film plating, a condenser electrode pattern was printed on an insulating material green sheet, and then a condenser dielectric material layer was printed thereon. After formation, pressing and firing of laminate, formation of polyimide resin insulating film and throughholes of Cu conductor were carried out in the same manner as in the case of the green sheet method.

It was possible to use an organic polymer such as polyimide resin as an insulating material on the ceramic multi-layer circuit board as in this Example. Since there was the organic polymer having a lower dielectric constant than that of the ceramic insulating material around the throughholes in the condenser dielectric material layer, the influence of the condenser dielectric material upon the signal transmission speed could be much more reduced.

The delay time of this Example was about 50% on the basis of the delay time when the condenser dielectric material was in contact with the throughholes, and thus the signal transmission could be made about 50% faster.

According to the present invention, a condenser-containing, ceramic multi-layer circuit board without impairing the signal transmission speed can be obtained, and when the present condenser-containing, ceramic multi-layer circuit board is applied to a board for a large-scale electronic computer, etc., the condenser can reduce the electric noise and thus the computing speed can be made faster than the conventional speed. That is, the computing can be made faster than the conventional one as a total computer performance.

What is claimed is:

1. A semiconductor module which comprises a multi-layer board, a carrier board provided on the multi-layer board and a semiconductor device provided on the carrier board, the carrier board being a condenser-containing, ceramic multi-layer circuit board which comprises a plurality of layers of ceramic insulating material having circuit conductors, throughholes and condensers composed of ceramic dielectric condenser material having a higher dielectric constant than that of the ceramic insulating material and a pair of electrodes sandwiching the ceramic dielectric condenser material, the condensers being in a layer structure with openings concentric to the corresponding throughholes and having a larger diameter than the diameter of the throughholes with a distance between the condenser opening edges surrounding the corresponding throughholes and the throughhole peripheral edges, thereby forming clearances therebetween and the ceramic insulating material being filled in the clearances between the condenser opening edges and the corresponding throughhole peripheral edges without any contact with the ceramic dielectric condenser material and the throughholes.

2. A semiconductor module according to claim 1, wherein the distance between the condenser opening edges surrounding the corresponding throughholes and the throughhole peripheral edges is 5 to 200 μm.

3. A semiconductor module according to claim 1, wherein the ceramic insulating material and the ceramic dielectric condenser material are sinterable at not more than 1,000° C.

4. A semiconductor module according to claim 1, wherein the conductor for the electrode, circuit and throughholes is a metal or alloy sinterable at not more than 1,000° C.

5. A condenser-containing, ceramic multi-layer circuit board which comprises a plurality of layers of ceramic insulating material having circuit conductors, throughholes and condensers composed of ceramic dielectric condenser material having a higher dielectric constant than that of the ceramic insulating material and a pair of electrodes sandwiching the ceramic dielectric condenser material, the condensers being in a layer structure with openings concentric to the individual throughholes and having a larger diameter than the diameter of the throughholes with a distance between the condenser opening edges surrounding the corresponding throughholes and the throughhole peripheral edges, thereby forming clearances therebetween and the ceramic insulating material being filled in the clearances between the condenser opening edges and the corresponding throughhole peripheral edges without any contact with the ceramic dielectric condenser material and the throughholes.

6. A condenser-containing, ceramic multi-layer circuit board according to claim 5, wherein the distance between the condenser opening edges surrounding the corresponding throughholes and the throughhole peripheral edges is 5 to 200 μm.

7. A condenser-containing, ceramic multi-layer circuit board according to claim 5, wherein the ceramic insulating material and the ceramic dielectric condenser material are sinterable at not more than 1,000° C.

8. A condenser-containing, ceramic multi-layer circuit board according to claim 5, wherein the conductor for the electrode, circuit and throughholes is a metal or alloy sinterable at not more than 1,000° C.

9. A computer which comprises a semiconductor module which comprises a multi-layer board, a carrier board provided on the multi-layer board and a semiconductor device provided on the carrier board, the carrier board being a condenser-containing, ceramic multi-layer circuit board which comprises a plurality of layers of ceramic insulating material having circuit conductors, throughholes and condensers composed of ceramic dielectric condenser material having a higher dielectric constant that of the ceramic insulating material and a pair of electrodes sandwiching the ceramic dielectric condenser material, the condensers being in a layer structure with openings concentric to the corresponding throughholes and having a larger diameter than the diameter of the throughholes with a distance between the condenser opening edges surrounding the corresponding throughholes and the throughhole peripheral edges, thereby forming clearance therebetween and the ceramic insulating material being filled in the clearances between the condenser opening edges and the corresponding throughhole peripheral edges without any contact with the ceramic dielectric condenser material and the throughholes.

10. A computer according to claim 9, wherein the distance between the condenser opening edges surrounding the corresponding throughholes and the throughhole peripheral edges is 5 to 200 μm.

11. A computer according to claim 9, wherein the ceramic insulating material and the ceramic dielectric condenser material are sinterable at not more than 1,000° C.

12. A computer according to claim 9, wherein the conductor for the electrode, circuit and throughholes is a metal or alloy sinterable at not more than 1,000° C.

* * * * *